(12) United States Patent
Susa et al.

(10) Patent No.: US 10,707,073 B2
(45) Date of Patent: Jul. 7, 2020

(54) FILM FORMING METHOD AND PATTERNING METHOD

(71) Applicant: ASM IP Holding B.V., Almere (NL)

(72) Inventors: Yoshio Susa, Tama (JP); Yuko Kengoyama, Tama (JP); Taishi Ebisudani, Tama (JP)

(73) Assignee: ASM IP Holding B.V., Almere (NL)

( * ) Notice: Subject to any disclaimer, the term of this patent is extended or adjusted under 35 U.S.C. 154(b) by 38 days.

(21) Appl. No.: 15/695,147

(22) Filed: Sep. 5, 2017

(65) Prior Publication Data

US 2019/0074172 A1 Mar. 7, 2019

(51) Int. Cl.
| | |
|---|---|
| *H01L 21/02* | (2006.01) |
| *H01L 21/28* | (2006.01) |
| *H01L 21/033* | (2006.01) |
| *H01L 21/311* | (2006.01) |
| *C23C 16/455* | (2006.01) |
| *C23C 16/56* | (2006.01) |
| *C23C 16/40* | (2006.01) |
| *C23C 16/04* | (2006.01) |

(52) U.S. Cl.
CPC ........ *H01L 21/0228* (2013.01); *C23C 16/045* (2013.01); *C23C 16/401* (2013.01); *C23C 16/45527* (2013.01); *C23C 16/45536* (2013.01); *C23C 16/45553* (2013.01); *C23C 16/56* (2013.01); *H01L 21/02126* (2013.01); *H01L 21/02164* (2013.01); *H01L 21/02211* (2013.01); *H01L 21/02219* (2013.01); *H01L 21/02274* (2013.01); *H01L 21/0332* (2013.01); *H01L 21/0337* (2013.01); *H01L 21/28194* (2013.01); *H01L 21/31116* (2013.01); *H01L 21/31138* (2013.01); *H01L 21/31144* (2013.01)

(58) Field of Classification Search
CPC .................................................. H01L 21/02211
See application file for complete search history.

(56) References Cited

U.S. PATENT DOCUMENTS

| | | | |
|---|---|---|---|
| 2016/0181089 A1* | 6/2016 | Liang | B81B 3/00 438/778 |
| 2017/0107614 A1* | 4/2017 | Lee | C23C 16/345 |
| 2017/0133204 A1* | 5/2017 | Moyama | H01J 37/32238 |
| 2019/0067284 A1* | 2/2019 | Ching | H01L 21/02532 |

FOREIGN PATENT DOCUMENTS

| | | |
|---|---|---|
| JP | 2002-367990 A | 12/2002 |
| JP | 2008-537848 A | 9/2008 |
| JP | 2009-170439 A | 7/2009 |
| JP | 2013-021360 A | 1/2013 |
| WO | 2006/107417 A3 | 10/2006 |

\* cited by examiner

*Primary Examiner* — Peniel M Gumedzoe
*Assistant Examiner* — Christopher A Johnson
(74) *Attorney, Agent, or Firm* — Studebaker & Brackett PC (57) ABSTRACT

Examples of a film forming method includes repeating first processing and second processing in this order a plurality of times, wherein the first processing supplies material-1 having one silicon atom per molecule onto a substrate, and then generates plasma while reactant gas is introduced, thereby forming a silicon oxide film on the substrate, and the second processing provides material-2 having two or more silicon atoms per molecule onto the substrate, and then generates plasma while no reactant gas is introduced, thereby forming a double silicon compound on the substrate.

13 Claims, 8 Drawing Sheets

|   | Film B Comparative example | Film A Embodiment1 |
|---|---|---|
| Si | 64% | 65% |
| O | 36% | 35% |
| C | 0.0001% | 0.001% |
| H | 0.001% | 0.0001% |
| N | 0.0001% | 0.001% | impurities { C, H, N }

| Title | Comparative Example | Sequence 1 | Sequence 2 |
|---|---|---|---|
| ALD Tool ID | 3 | 2 | |
| Procedure | CK=0_35nm | [1st Unit]CK=0_20nm<br>+<br>[2nd Unit]CK=3_15nm | CK=3_35nm |
| As-depo | No data | pic2 | pic4 |
| After etch-back | pic1 | pic3 | pic5 |

FIG. 10

FILM FORMING METHOD AND PATTERNING METHOD

BACKGROUND

Field

Examples are described which relate to a film forming method and a patterning method.

Background Art

According to film formation based on well-known PEALD (Plasma Enhanced Atomic Layer Deposition), the density of a film to be formed can be controlled by changing the type of a precursor serving as a material for the film to be formed. However, only the change of the type of the precursor is insufficient to control the composition ratio of the film to be formed or the contents of impurities in the film.

SUMMARY

Some examples described herein may address the above-described problem. Some examples described herein may provide a film forming method and a patterning method that are capable of controlling the composition ratio of a film or the contents of impurities.

In some examples, a film forming method for repeating first processing and second processing in this order a plurality of times, wherein the first processing supplies material-1 having one silicon atom per molecule onto a substrate, and then generates plasma while reactant gas is introduced, thereby forming a silicon oxide film on the substrate, and the second processing provides material-2 having two or more silicon atoms per molecule onto the substrate, and then generates plasma while no reactant gas is introduced, thereby forming a double silicon compound on the substrate.

In some examples, a patterning method includes forming a spacer layer covering on a core film by repeating first processing and second processing in this order a plurality of times, the first processing supplying material-1 having one silicon atom per molecule onto a substrate and then generating plasma while introducing reactant gas flow, thereby forming a silicon oxide on the substrate, and the second processing supplying material-2 having two or more silicon atoms per molecule onto the substrate and then generating plasma without introducing any reactant gas flow, thereby forming a double silicon compound on the substrate, etching a part of the spacer layer to expose an upper portion of the core film, removing the core film while leaving the spacer layer, and etching a pattern target layer below the spacer layer utilizing the spacer layer as a mask.

DETAILED DESCRIPTION

A film forming method and a patterning method according to an embodiment will be described with reference to the drawings. The same or corresponding constituent elements are represented by the same reference numerals, and repetitive descriptions thereof may be omitted in the following description.

Figure 1:
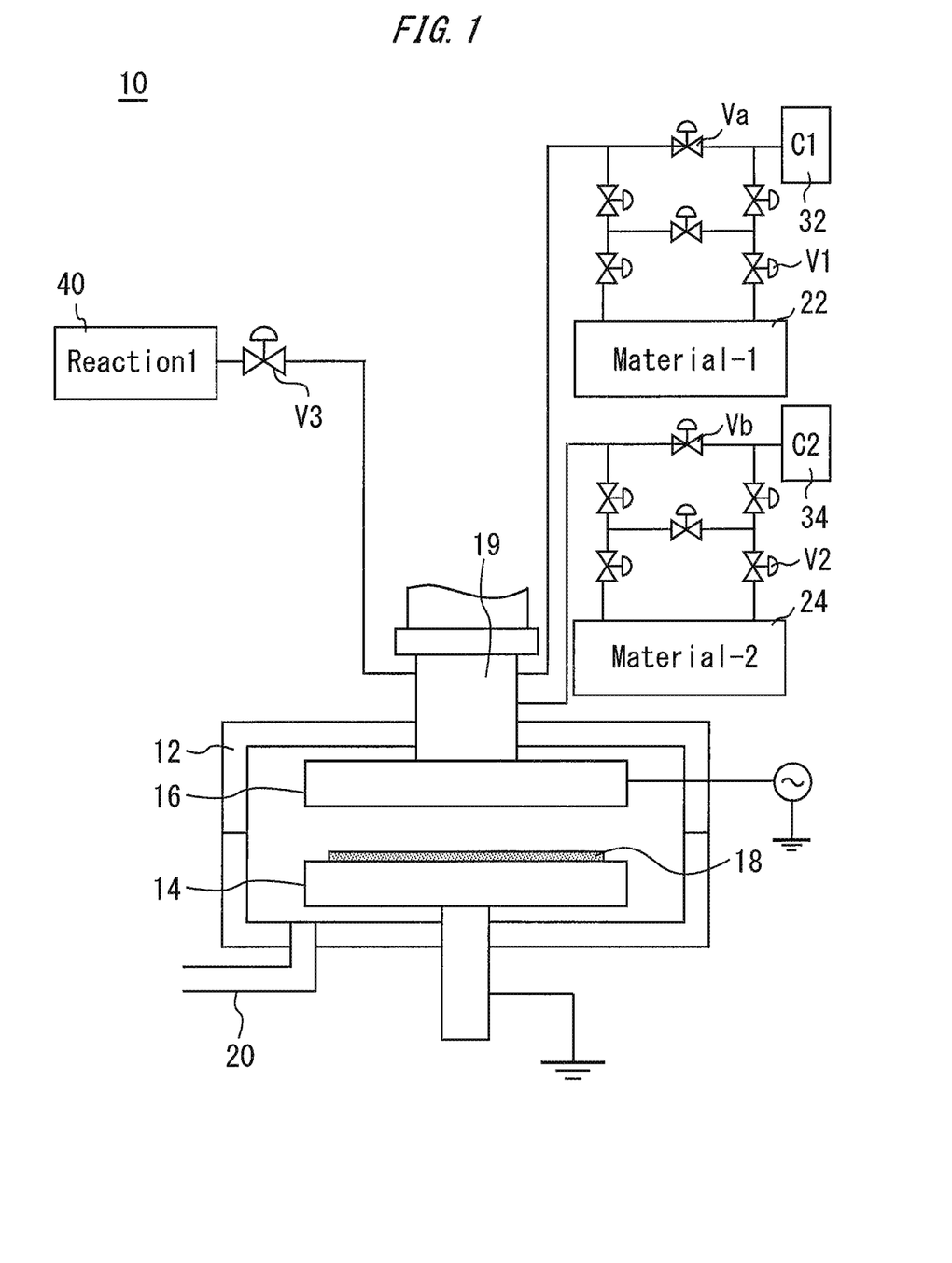
FIG. 1 is a cross-sectional view of a film formation apparatus.

FIG. 1 is a cross-sectional view of a film formation apparatus 10 used for a film forming method. This film formation apparatus 10 may include a chamber 12. The chamber 12 may also be called a "reactor chamber." The chamber 12 is internally provided with a susceptor 14 and an RF plate 16 for radio frequency wave heating. The susceptor 14 and the RF plate 16 may serve as a pair of parallel planar electrodes. The susceptor 14 is electrically grounded and RF power is applied to the RF plate 16, and it is thereby possible in some examples to excite plasma between the electrodes. Processing using the plasma, such as film formation processing is applied to a substrate 18 provided on the susceptor 14. The RF plate 16 may function as a shower plate. It is possible in some examples to supply a required gas into the chamber 12 via a manifold 19 and the RF plate 16. A flow rate of the gas supplied to the chamber 12 is controlled by, for example, a mass flow controller. The gas supplied to the chamber 12 is discharged from the chamber 12 through an exhaust pipe 20.

The film formation apparatus 10 is provided with a plurality of gas supply sources. More specifically, the film formation apparatus 10 is provided with vaporized material-1 22, vaporized material-2 24, carrier gas sources 32, 34, and reaction gas source 40. The material-1 22 and the material-2 24 are stored in a liquid state. Valves V1, Va, V2, Vb, V3 are connected to the respective gas sources. Valve V1 include 5 valves and valve V2 includes 5 valves.

The material-1 22 contains one silicon atom per molecule. That is, the material-1 22 is defined as a liquid material having one silicon atom per molecule. For example, BDEAS (Bis(diethylamino) silane) or 3DMAS [Tris(dimethylamino) silane] can be a candidate as material-1 22.

Figure 2:
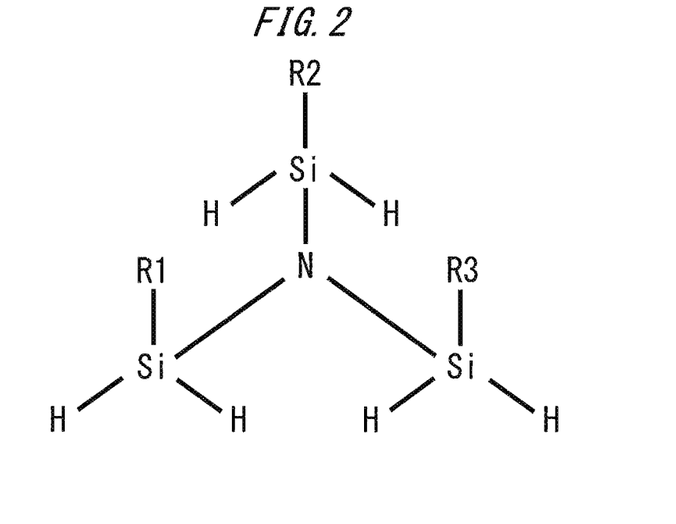
FIG. 2 is an example of a formula as the material-2 precursor.

The material-2 24 has two or more silicon atoms per molecule. That is, the material-2 24 is defined as a liquid material having two or more silicon atoms per molecule. For example, Trisilylamine (TSA) or the precursor, which has following formulae in FIG. 2, wherein R1 to R3 is each independently selected from a hydrogen, a liner or branched C2 to C10 alkyl group, and a linear or branched C2 to C12 alkenyl group, can be a candidate of material-2 24.

$O_2$ gas is preserved in a reactant gas source 40, and gas such as Ar or He is preserved in carrier gas sources 32, 34.

A controller, for example configured by a microcomputer, controls valves V1, Va, V2, Vb and V3 and a massflow controller based on a recipe.

Figure 3:
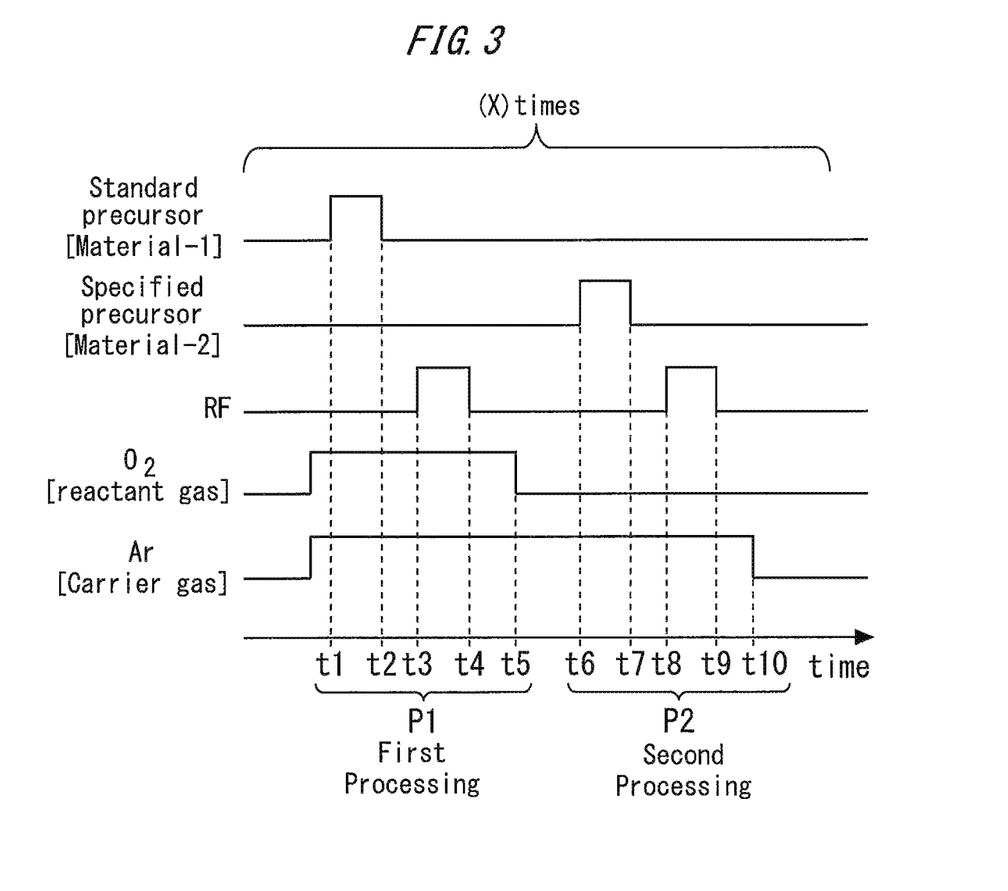
FIG. 3 is a sequence diagram showing a film forming method for a standard cycle according to some examples described herein.

FIG. 3 is a sequence diagram showing a film forming method according to some examples. In this film forming method, first processing P1 and second processing P2 are repetitively performed in this order a plurality of times to form a film on a substrate. The processing is started from a state under which all the valves are closed. In the first processing P1, the vaporized material-1 22 and the reactant gas are supplied into a chamber 12 during the period from a time t1 to a time t2. Specifically, the valves V1, Va and V3 are opened to supply the vaporized material-1 22 into the chamber 12 together with carrier gas, and also supply the reactant gas from the reactant gas source 40 into the chamber 12, whereby the material-1 22 is supplied onto the substrate 18 and adsorbed on the substrate 18.

Subsequently, the absorbed material-1 22 is purged from the chamber 12 during the period from the time t2 to a time t3. Specifically, the valve V1 is closed to stop supply of the vaporized material-1 22 into the chamber 12. However, the reactant gas and the carrier gas are supplied into the chamber 12 during the period from the time t2 to the time t3.

Subsequently, during the period from the time t3 to a time t4, radio-frequency power is applied to an RF plate 16 to generate plasma above the substrate 18, which causes oxidation of material-1 22 and formation of a silicon oxide on the substrate 18. Subsequently, the inside of the chamber 12 is evacuated again during the period from the time t4 to a time t5. Specifically, the supply of the reactant gas and the carrier gas into the chamber 12 is continued. As is apparent from FIG. 3, the supply of the reactant gas and the carrier gas into the chamber 12 is continued from the time t2 till the time t5. In short, in the first processing P1, the material-1 22 is supplied onto the substrate 18, and then plasma is generated while introducing the reactant gas flow, thereby forming silicon oxide on the substrate 18.

When the first processing P1 is finished, the process is transferred to the second processing P2. In the second processing P2, no reactant gas is supplied into the chamber 12. That is, the valve V3 is kept closed over the entire period of the second processing P2. In the second processing P2, the material-2 24 is firstly supplied into the chamber 12 during the period from a time t6 to a time t7. Specifically, the valves V2 and Vb are opened to supply the vaporized material-2 24 into the chamber 12 together with the carrier gas, whereby the material-2 is provided onto the substrate 18 and adsorbed on the substrate 18.

Subsequently, adsorbed material-2 is purged from the chamber 12 during the period from the time t7 to a time t8. Specifically, the valve V2 is closed to stop supply of the material-2 24 into the chamber 12. Accordingly, during the period from the time t7 to the time t8, only the carrier gas is supplied into the chamber 12.

Subsequently, during the period from the time t8 to a time t9, radio-frequency power is applied to the RF plate 16 to generate plasma above the substrate 18. Specifically, the material-2 24 is bombarded to the base material of the substrate 18 with argon plasma. Since no reactant gas is supplied to the chamber 12 in the second processing P2, no significant oxidation occurs in the material-2 24. A double silicon compound is produced by this processing, and the composition of the double silicon compound is SiCH because the material-2 24 contains carbon (C).

Subsequently, the inside of the chamber 12 is evacuated again during the period from a time t9 to a time t10. Specifically, the carrier gas is supplied into the chamber 12. In short, in the processing from the time t6 to the time t10, $O_2$ gas as the reactant gas is not introduced, the material-2 24 is supplied to the substrate 18, the supply of the material-2 24 is stopped, and plasma is generated to form a film on the substrate 18. That is, in the second processing P2, the material-2 24 is supplied to the substrate 18, and then plasma is generated without introducing any reactant gas flow, thereby forming a double silicon compound on the substrate 18.

The series of processing from the time t1 to the time t10 is set as one cycle, and processing is executed for a plurality of cycles until a predetermined film thickness is achieved. By setting the number of cycles to several hundreds, a film having a film thickness of, for example, several tens of nm can be formed.

Figure 4:
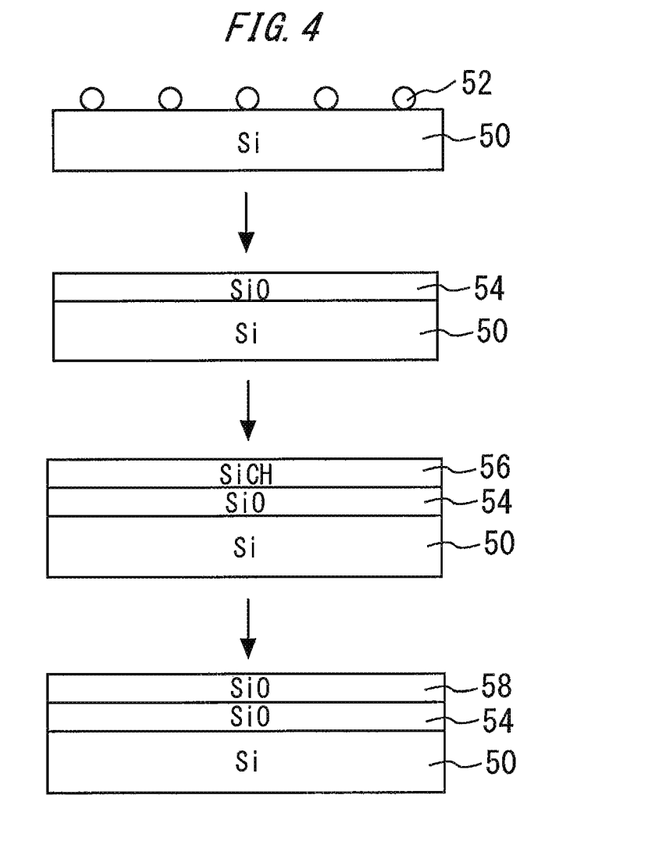
FIG. 4 is a cross-sectional view showing the film forming process in semiconductor device.

FIG. 4 is a cross-sectional view showing the film forming method in a semiconductor device according to some examples. First, as shown at the uppermost stage of FIG. 4, a material-1 52 is adsorbed on a substrate 50. Subsequently, plasma is generated while supplying the reactant gas, thereby forming a silicon compound 54 on the substrate 50. Since the reactant gas contains oxygen, the single silicon compound 54 is a silicon oxide film. The series of processing so far corresponds to the first processing.

Subsequently, a double silicon compound 56 is formed in the second processing. Since no reactant gas is supplied in the formation of the double silicon compound 56, the double silicon compound 56 is a silicon-richer film having a smaller content of oxygen as compared with a silicon oxide film.

Subsequently, a second process including the first processing P1 and the second processing P2 is performed. That is, this process corresponds to a second ALD cycle. It depends on the processing condition whether the double silicon compound 56 is mixed with the upper and lower films or maintains a composition different from those of the upper and lower films after the second ALD cycle is finished. The first processing P1 and the second processing P2 are repetitively performed in this order a plurality of times to form a film having a predetermined thickness.

According to the film forming method described herein, the quality of the film to be formed may be controlled by adding one ALD cycle with the second processing P2 as compared with a case where one ALD cycle is constructed by only the first processing P1. Specifically, the first processing P1 utilizes the reactant gas for plasma-based film formation whereas the second processing P2 utilizes no reactant gas for plasma-based film formation. Furthermore, the material-1 22, which is used in the first processing P1 as the precursor, contains one silicon atom per molecule whereas the material-2 24, which is used in the second processing P2 as the precursor, contains two or more silicon atoms per molecule. Accordingly, the single silicon compound 54 formed in the first processing P1 and the double silicon compound 56 formed in the second processing P2 are different in composition ratio and impurity content. In some examples, the SiO composition ratio is different between the single silicon compound 54 and the double silicon compound 56, and the contents of impurities such as C, H, N, etc. are different between the single silicon compound 54 and the double silicon compound 56.

Figure 5:
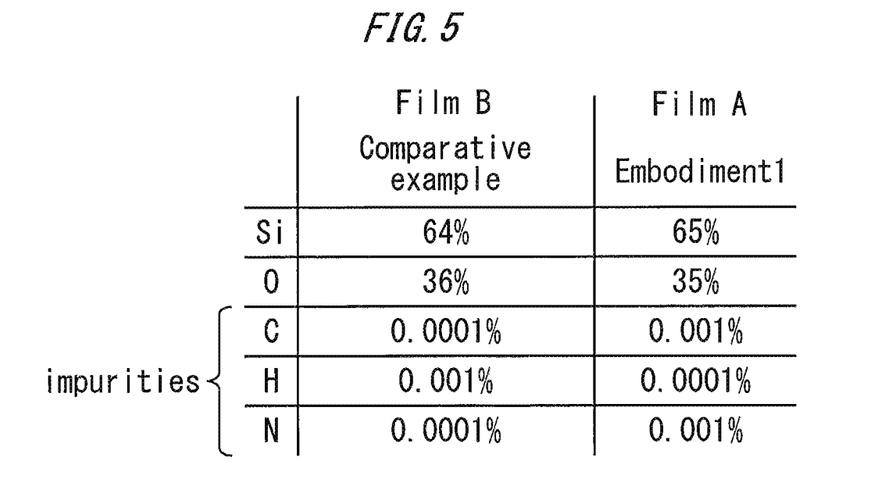
FIG. 5 is a table showing examples of compositions of films.

FIG. 5 is a table showing examples of composition of a film A formed by the film forming method described herein and a film B as a comparative example. The film A formed by the film forming method described herein is a film which is formed to contain Si, O, C, H and N by repetitively performing the first processing P1 and the second processing P2 in this order a plurality of times. The film B as the comparative example is a film which is formed to contain Si, O, C, H and N by repetitively performing the first processing P1 without performing the second processing P2.

The film B as the comparative example is formed by using the material-1 22 containing one silicon atom per molecule, and thus the silicon concentration of the film B is equal to 64%. The film A is formed by using the material-2 24 containing two or more silicon atoms per molecule in the second processing P2 in addition to the first processing P1, and thus the silicon concentration of the film A is equal to 65%. Thus, according to the film forming method described herein, a Si-richer film may be formed as compared with the comparative example.

Furthermore, since the examples described herein do not use any reactant gas in the second processing P2, the oxygen concentration of the film A is equal to 35%, and thus the examples described herein may reduce the oxygen concentration lower than that of 36% of the film B of the comparative example. Furthermore, comparing the film B of the comparative example with the film A of the example, the concentration of impurities C, H and N are different between the film A and the film B. A slight difference in impurity concentration may greatly affect the film quality.

The film composition and the impurity content may be controlled by adjusting the content of the second processing P2. In the examples described herein, the adsorption state and active state of the surface of the film after the first processing P1 may be changed by performing the second processing P2, and then the interface of the formed film may be controlled by executing a new ALD cycle.

Techniques described herein may be developed for various film forming methods required to control the composition ratio of a film or the contents of impurities in the film. The techniques and components described with reference to FIG. 1-FIG. 5 may be applicable to a film forming method according to other embodiments described herein. Note that since the film forming method according to other embodiments may include many points common to those of the embodiments described with reference to FIG. 1-FIG. 5, they will be described focusing on differences from what has already been described.

Figure 6:
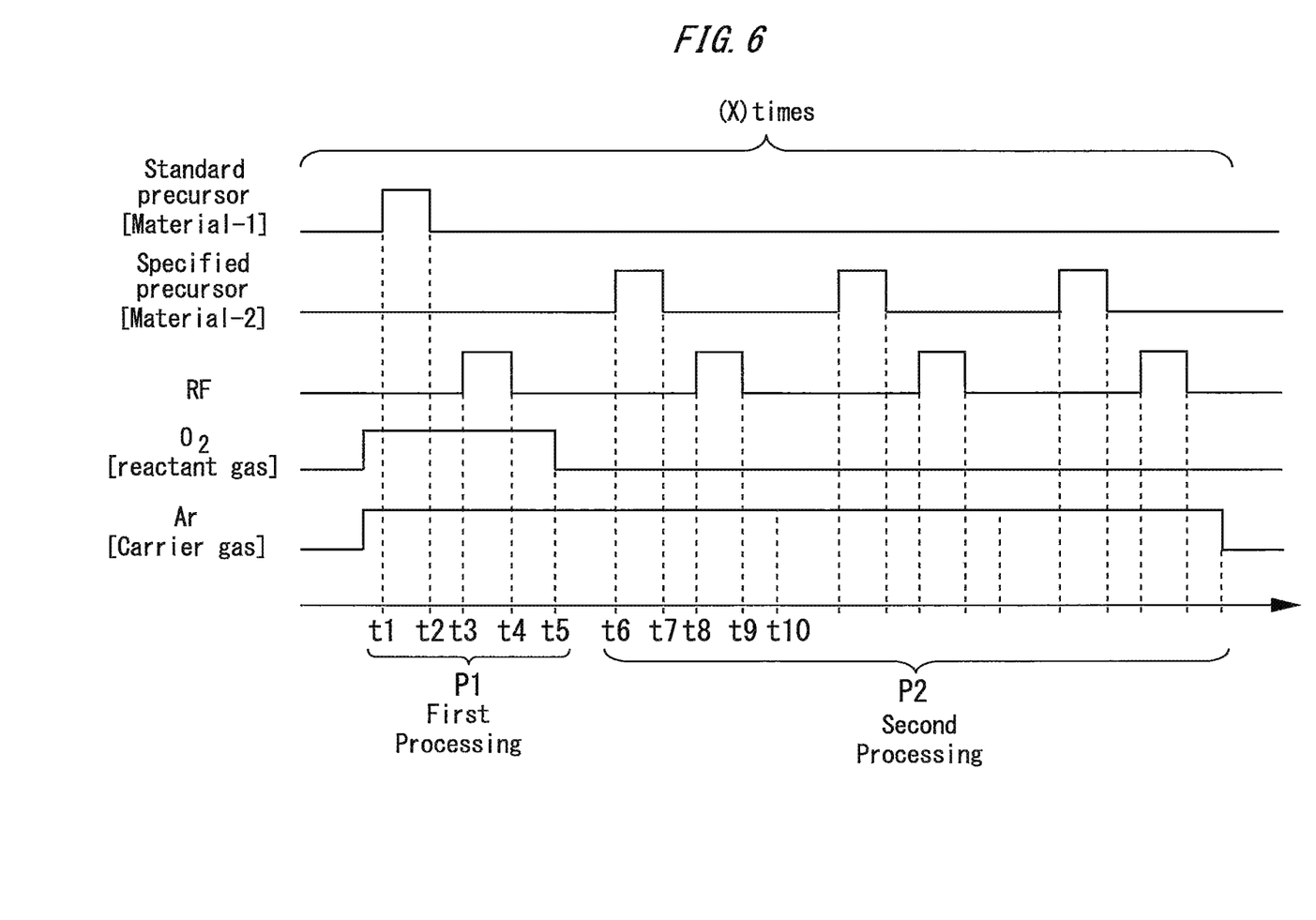
FIG. 6 is a sequence diagram showing a film forming method for an advanced cycle according to some examples described herein.

FIG. 6 is a sequence diagram showing a film forming method according to some examples. In the second processing P2, a series of processing of supplying the material-2 24 to a substrate 18 and then forming a double silicon compound is repeated a plurality of times. In the following description, a series of processing of supplying the material-2 24 to the substrate 18 and then generating plasma to form the double silicon compound is referred to as "unit processing". The processing content from a time t6 to a time t10 in FIG. 6 corresponds to the unit processing. In the second processing P2, the foregoing unit processing may be repeated three times. The repeat count is not limited to a specific value insofar as it is multiple. After the second processing P2 is finished, the process goes to the first processing P1 of the next ALD cycle.

Figure 7:
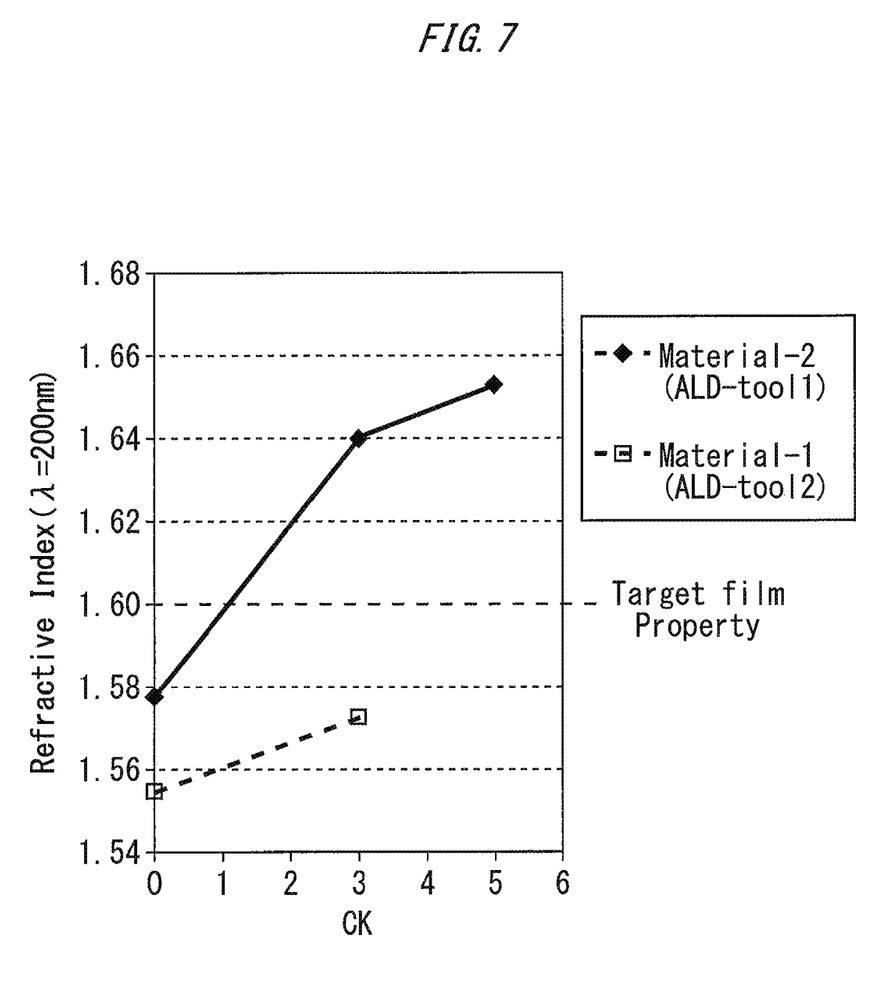
FIG. 7 is a diagram showing the relationship between the repeat count of the unit processing and the refractive index.

FIG. 7 is a diagram showing the relationship between the repeat count of the unit processing and the refractive index. A solid line material-2 represents a graph in which the abscissa axis represents the repeat count (CK: Control Knob) of the unit processing in one ALD cycle, and the ordinate axis represents the refractive index of a formed film. The refractive index of the solid line material-2 is associated with a film which is obtained by repetitively performing the unit processing at only a repeat count indicated on the abscissa axis after the first processing P1. A film having a film thickness of about 26 nm is obtained by the unit processing. The data represented by the solid line material-2 in FIG. 7 are obtained under the condition that Material-2 24 is used as the precursor both in first processing P1 and second processing P2. From the solid line material-2 of FIG. 7, it is apparent that the refractive index of the formed film greatly increases as the repeat count (CK) increases.

FIG. 7 shows a comparative example represented by a broken line Material-1. The comparative example represented by the broken line Material-1 is similar to the examples described herein in that a single silicon compound 54 is formed while the reactant gas is supplied, and the double silicon compound 56 is formed without supplying any reactant gas. The broken line material-1 is associated with a film obtained by using material-1 22 as the precursors in the first processing P1 and the second processing P2. The repeat count (CK) for the broken line Material-1 corresponds to the repeat count of the series of processing for supplying the material-1 22 to the substrate 18 and then generating plasma to form a double silicon compound 56 in the second processing P2. A film having a film thickness of about 60 nm is obtained by the unit processing.

In the case of the solid line using the material-2 24 in the second processing P2, the amount of increase in refractive index, when the repeat count (CK) is increased, is greater than that of the broken line Material-1 using the material-1 22 in the second processing P2. Accordingly, the refractive index can be greatly changed by changing the repeat count of the unit processing in the second processing P2. The refractive index of the film has strong correlations with, for example, the film composition ratio of SiO or the like and the impurity concentration of C or the like. Therefore, the variation of the refractive index of the film suggests that the composition ratio and the impurity concentration in the film are varied. For example, when it is required to form a film having a refractive index of 1.6 or more, the repeat count in the second processing P2 may be set to three or more. However, in the case of the broken line Material-1, the refractive index cannot be increased to 1.6 or more even by setting the repeat count to three.

In some examples, the refractive index of the film can be greatly changed by adjusting the repeat count of the unit processing of the second processing P2 in one ALD cycle, so that the film quality can be controlled with higher degree of freedom. The control of the film quality may make it possible in some examples to control breakdown voltage, hardness or stress.

FIG. 8 is a cross-sectional view showing a patterning method according to some examples. In this example, a core film 64 is formed on a pattern target layer 62 on a substrate 60 by patterning as shown in FIG. 8A. A resist which is an organic film may be used as the core film 64. Subsequently, a spacer layer is formed. FIG. 8B shows a spacer layer 66. The spacer layer 66 is formed by repeating the following first processing P1 and second processing P2 in this order a plurality of times. The first processing P1 supplies the material-1 22 having one silicon atom per molecule to a substrate 60, and then generates plasma while introducing reactant gas flow, thereby forming a single silicon compound on the substrate 60, and the second processing P2 supplies the material-2 24 having two or more silicon atoms per molecule to the substrate 60 and then generates plasma without introducing any reactant gas flow, thereby forming a double silicon compound on the substrate. The spacer layer 66 covers the core film 64.

The spacer layer 66 may be formed according to the film forming method described with reference to FIG. 1 or FIG.

Figure 8A:
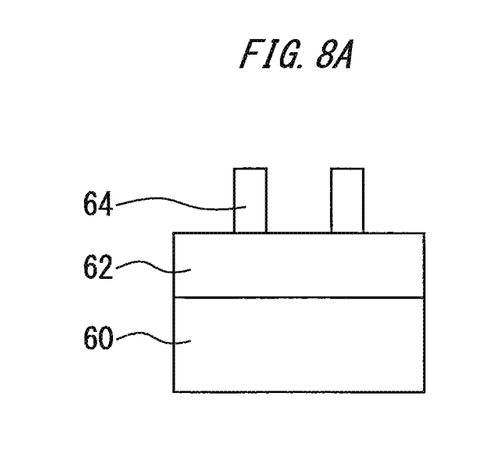
FIG. 8A shows a core film, pattern target layer, and substrate.
Figure 8B:
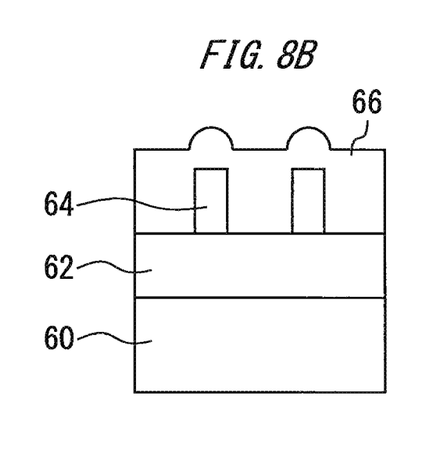
FIG. 8B shows a spacer layer.
Figure 8C:
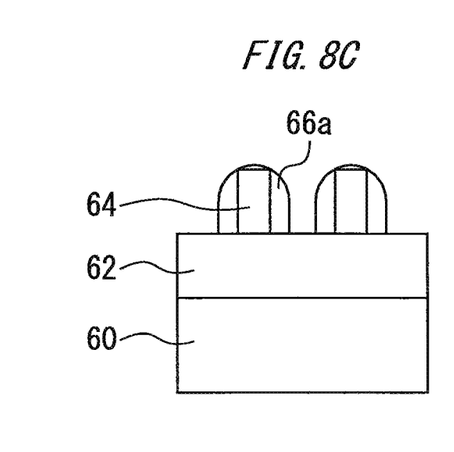
FIG. 8C shows a partially etched spacer layer.

7. Accordingly, an example of the spacer layer 66 is a silicon oxide film. Subsequently, a part of the spacer layer 66 is etched. FIG. 8C shows a partially etched spacer layer 66a. The spacer layer 66a exposes the upper portion of the core film 64. The pattern target layer 62 is exposed by this processing. The spacer layer 66a is left as a side wall of the core film 64.

Figure 8D:
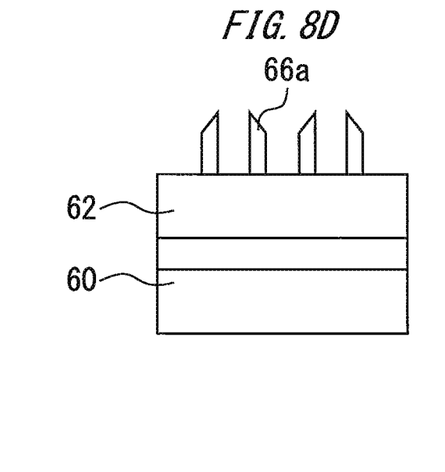
FIG. 8D shows a state that the core film is removed.

Subsequently, the core film 64 is removed while leaving the spacer layer 66a. FIG. 8D shows a state that the core film 64 is removed. A dry etching method is used to remove the core film 64 serving as a carbon hard mask. When the spacer layer 66a falls down due to the dry etching, it would be impossible to perform accurate patterning on the pattern target layer 62. Therefore, it is required to prevent deformation of the spacer layer 66a before and after the dry etching and keep the spacer layer 66a in a basically vertical shape. Factors causing the spacer layer 66a to fall down are assumed to be the stress of the spacer layer 66a, the difference in stress between the spacer layer 66a and the core film 64 or the adhesion force between the spacer layer 66a and the core film 64. The control of the film quality may be easily performed because the spacer layer 66 is formed by the film forming method described herein with reference to FIGS. 1-7. Therefore, a condition which enables prevention of the deformation of the spacer layer 66a has been found by conducting an experiment in advance, and the spacer layer 66 is formed under the thus-found condition.

Figure 8E:
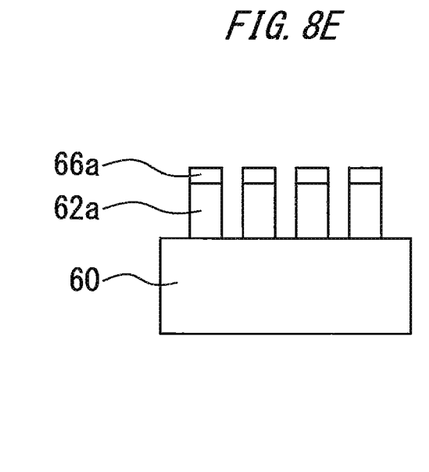
FIG. 8E shows an etched layer which has been patterned by the etching.
Figure 8F:
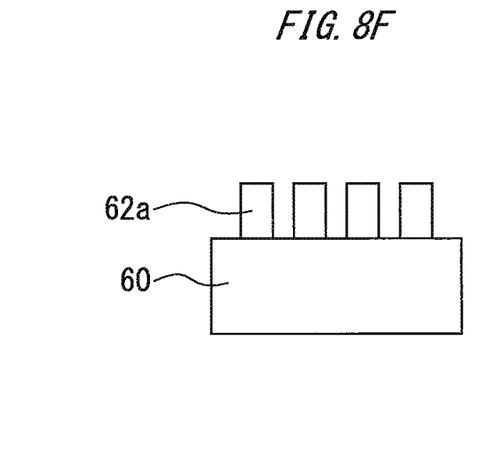
FIG. 8F shows the etched layer from which the spacer layer has been removed.

Subsequently, the pattern target layer 62 is etched utilizing the spacer layer 66a as a mask. FIG. 8E shows an etched layer 62a which has been patterned by the etching. The spacer layer 66a remains on the etched layer 62a. Subsequently, the remaining spacer layer 66a is removed. FIG. 8F shows the etched layer 62a from which the spacer layer 66a has been removed. The patterning method described herein is called as a double patterning method, and it patterns the pattern target layer 62.

Figure 9:
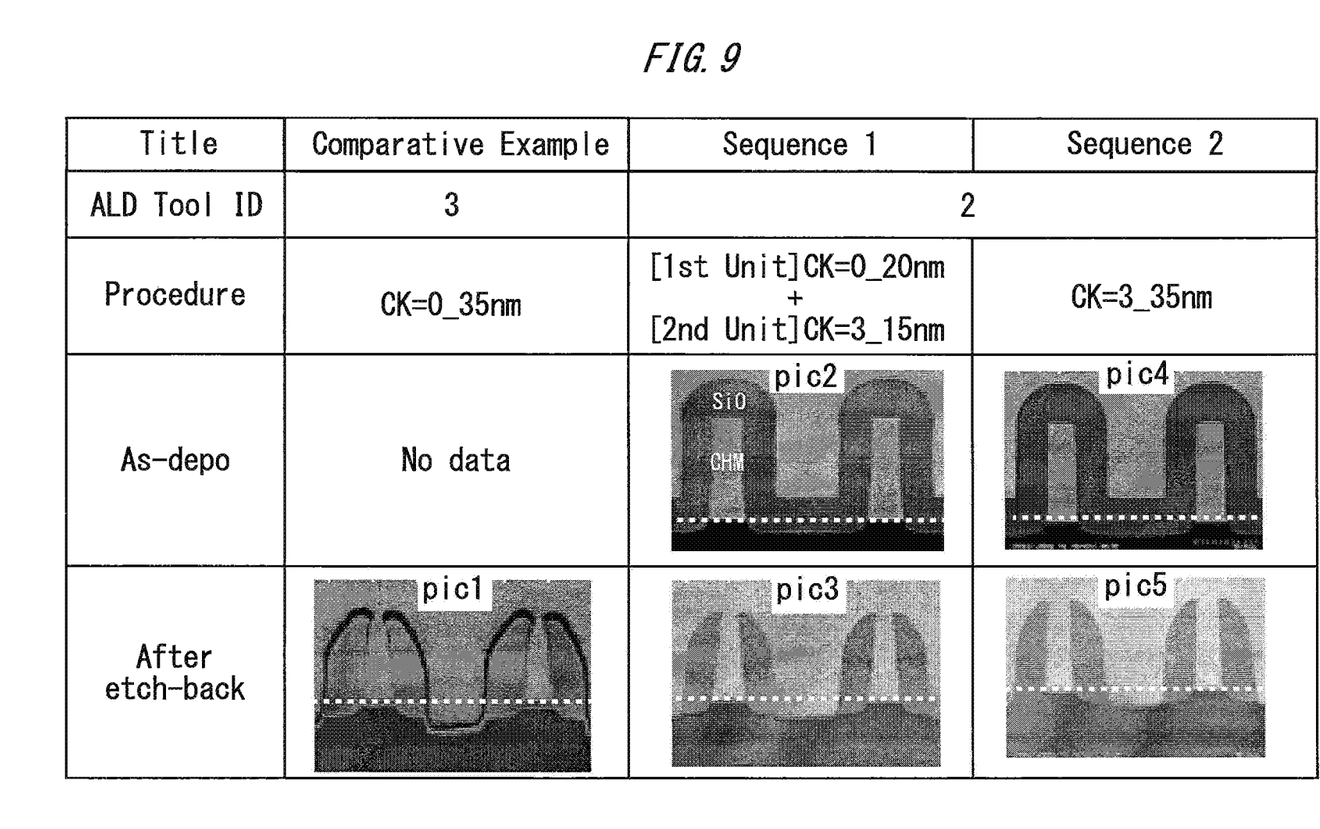
FIG. 9 is a cross-sectional view showing a structure obtained in the course of the double patterning process.

FIG. 9 is a cross-sectional view showing a structure obtained in the course of the double patterning process. A spacer layer in a comparative example is formed by performing the first processing P1 a plurality of times without performing the second processing P2. In this case, when the core film is removed by dry etching, the spacer layer is greatly tilted as shown in pic1.

The spacer layer in Sequence 1 is formed by repetitively performing the first processing P1 and the second processing P2. A film of 20 nm is formed by performing only the first processing P1, and thereafter a film of 15 nm is formed by performing the unit processing three times. The material-1 22 is used as the precursor both of the first processing P1 and the second processing P2. Pic2 shows the spacer layer which has been just formed, and pic3 shows the spacer layer from which the core film has been removed. In the case of the Sequence 1, the tilt of the spacer layer can be more greatly relaxed as compared with the pic1 of the comparative example.

The spacer layer of Sequence 2 is formed by repetitively performing the first processing P1 and the second processing P2. A film of 35 nm is formed by performing the unit processing three times. The material-1 22 is used as the precursor both of the first processing P1 and the second processing P2. Pic4 shows the spacer layer which has been just formed. Pic5 shows the spacer layer from which the core film has been removed. In the case of the Sequence 2, the tilt of the spacer layer can be more greatly relaxed as compared with the pic1 of the comparative example and the pic3 of the Sequence 1.

Generally, when the core film has been removed, the spacer layer is liable to fall down, which makes a difficulty for following process. Therefore, the patterning method described herein with reference to FIGS. 8A-8F is helpful to suppress the falling down. With respect to the Sequences 1 and 2, it is estimated that film formation stress on the core film 64 is lowered by performing the second processing P2 when the spacer layer 66 is formed, whereby the spacer layer 66a is formed to have a substantially vertical shape. By performing the second processing P2 in one ALD cycle, the stress on the base material under film formation may be adjusted. This adjustment of the stress may make it possible in some examples to control the shape of the film to be formed.

Figure 10:
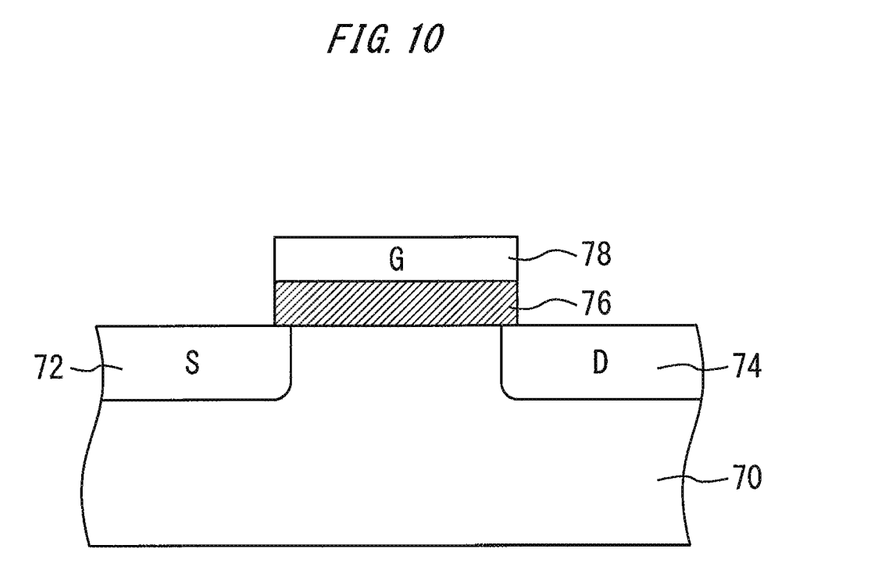
FIG. 10 is a cross-sectional view of a MOSFET.

In some examples, a gate insulation film is formed by the film forming method described herein with reference to FIGS. 1-7. FIG. 10 is a cross-sectional view of a MOSFET. This MOSFET includes a substrate 70, a source 72 and a drain 74 formed in the substrate 70, a gate insulation film 76 formed on the substrate 70, and a gate electrode 78 formed on the gate insulation film 76. The gate insulation film 76 is formed by repeating the first processing P1 and the second processing P2 in this order a plurality of times, thereby implementing various characteristics required to the gate insulation film 76.

According to some examples, first processing P1 using the material-1 22 and reactant gas, and second processing P2 using the material-2 24 containing more silicon atoms per molecule than the material-1 22 and using no reactant gas are performed in one ALD cycle. This process may make it possible in some examples to control the composition ratio of a film or the concentration of impurities in the film. It may also be possible to use the technical features of the film forming method and the patterning method of the respective embodiments described herein in combination.

Many modifications and variations are possible in the light of the above teachings. It is therefore to be understood that some variations may be practiced within the scope of the appended claims as specifically described.

What is claimed is:

1. A film forming method for repeating first processing and second processing in this order a plurality of times, wherein the first processing supplies material-1 having one silicon atom per molecule onto a substrate, and then generates plasma while one or more species of reactant gas are introduced, thereby forming a silicon oxide film on the substrate, and the second processing provides material-2 having two or more silicon atoms per molecule onto the substrate, and then generates plasma while one or more species of reactant gas are not introduced, thereby forming a double silicon compound on the substrate.

2. The film forming method according to claim 1, wherein the reactant gas is oxygen-containing gas.

3. The film forming method according to claim 1, wherein a double silicon compound is SiCH film.

4. The film forming method according to claim 1, wherein the material-1 is BDEAS(Bis(diethylamino) silane) or 3DMAS (Tris(dimethylamino)silane).

5. The film forming method according to claim 1, wherein the material-2 is Trisilylamine (TSA) or the precursor, which has formula (1):

formula (1)

wherein R1 to R3 is each independently selected from a hydrogen, a liner or branched C2 to C10 alkyl group, and a linear or branched C2 to C12 alkenyl group.

6. The film forming method according to claim 1, wherein the second processing repeats, for a plurality of times, a series of processing of supplying material-2 onto the substrate and then forming the double silicon compound.

7. The film forming method according to claim 1, wherein the first processing and the second processing are repeated in this order a plurality of times to form a film containing Si, O, C, H and N.

8. The film forming method according to claim 6, wherein a film having a refractive index of 1.6 or more is formed.

9. The film forming method according to claim 1, wherein the first processing and the second processing are repeated in this order a plurality of times to form a gate insulation film.

10. A patterning method comprising:
forming a spacer layer covering on a core film by repeating first processing and second processing in this order a plurality of times, the first processing supplying material-1 having one silicon atom per molecule onto a substrate and then generating plasma while introducing reactant gas flow, thereby forming a silicon oxide on the substrate, and the second processing supplying material-2 having two or more silicon atoms per molecule onto the substrate and then generating plasma without introducing any reactant gas flow, thereby forming a double silicon compound on the substrate;
etching a part of the spacer layer to expose an upper portion of the core film;
removing the core film while leaving the spacer layer; and
etching a pattern target layer below the spacer layer utilizing the spacer layer as a mask.

11. The patterning method according to claim 10, wherein the spacer layer when the core film is removed stands substantially vertical in cross-sectional view.

12. The patterning method according to claim 10, wherein the core film is a carbon hard mask, and a dry etching method is used when the core film is removed.

13. The film forming method according to claim 1,
wherein during the second processing, the plasma is generated from at least one gas selected from the group consisting of Ar and He.

* * * * *